(12) United States Patent
Kim et al.

(10) Patent No.: US 8,193,696 B2
(45) Date of Patent: Jun. 5, 2012

(54) OXYNITRIDE PHOSPHOR, METHOD OF PREPARING OXYNITRIDE PHOSPHOR, AND WHITE LIGHT EMITTING DEVICE INCLUDING THE OXYNITRIDE PHOSPHOR

(75) Inventors: Tae-gon Kim, Seoul (KR); Tae-hyung Kim, Seoul (KR); Seoung-jae Im, Seoul (KR)

(73) Assignees: Samsung Electronics Co., Ltd. (KR); Samsung Electro-Mechanics Co., Ltd. (KR)

( * ) Notice: Subject to any disclaimer, the term of this patent is extended or adjusted under 35 U.S.C. 154(b) by 99 days.

(21) Appl. No.: 12/871,331

(22) Filed: Aug. 30, 2010

(65) Prior Publication Data

US 2011/0109221 A1   May 12, 2011

(30) Foreign Application Priority Data

Nov. 6, 2009   (KR) .................. 10-2009-0107086

(51) Int. Cl.
*C09K 11/59* (2006.01)
*H01L 33/00* (2010.01)

(52) U.S. Cl. ........ 313/503; 313/501; 313/485; 313/486; 252/301.4 R; 252/301.4 F; 257/98; 257/99

(58) Field of Classification Search .................. 313/485, 313/486, 501, 503, 512; 252/301.4
See application file for complete search history.

(56) References Cited

U.S. PATENT DOCUMENTS

| | | | |
|---|---|---|---|
| 6,717,353 B1 * | 4/2004 | Mueller et al. | 313/501 |
| 7,321,191 B2 * | 1/2008 | Setlur et al. | 313/487 |
| 7,794,624 B2 * | 9/2010 | Tamaki et al. | 252/301.4 F |
| 7,951,308 B2 * | 5/2011 | Tamaki et al. | 252/301.4 F |
| 2003/0094893 A1 * | 5/2003 | Ellens et al. | 313/503 |
| 2006/0033081 A1 * | 2/2006 | Hintzen et al. | 252/301.4 F |
| 2007/0278930 A1 | 12/2007 | Takahashi et al. | |

FOREIGN PATENT DOCUMENTS

| | | |
|---|---|---|
| EP | 1413618 A1 * | 4/2004 |
| JP | 01-226117 B2 | 9/1989 |
| JP | 1994-143639 A | 5/1994 |
| JP | 2007-137946 A | 11/2008 |
| WO | 2008/146571 A1 | 12/2008 |

* cited by examiner

*Primary Examiner* — Sikha Roy
(74) *Attorney, Agent, or Firm* — Cantor Colburn LLP

(57) ABSTRACT

An oxynitride phosphor including: a compound represented by Formula 1:

$$M^1_{a-x}M^2_{x-y}Ce_ySi_{b-z}Al_zO_{c-x}N_x, \quad \text{Formula 1}$$

wherein $M^1$ is at least one element selected from the group consisting of calcium, strontium, barium, magnesium, zinc, and europium, $M^2$ is at least one element selected from the group consisting of scandium, yttrium, lutetium, lanthanum, praseodymium, samarium, gadolinium, terbium, ytterbium, and dysprosium, and a is about 1.7 to about 2.3, b is about 0.7 to about 1.3, c is about 3.5 to about 4.5, x is greater than 0 and less than about 2, y is greater than 0 and less than about 0.5, and z is equal to or greater than 0 and less than about 0.5.

19 Claims, 6 Drawing Sheets

US 8,193,696 B2

OXYNITRIDE PHOSPHOR, METHOD OF PREPARING OXYNITRIDE PHOSPHOR, AND WHITE LIGHT EMITTING DEVICE INCLUDING THE OXYNITRIDE PHOSPHOR

CROSS-REFERENCE TO RELATED APPLICATIONS

This application claims priority to Korean Patent Application No. 10-2009-0107086, filed on Nov. 6, 2009, and all the benefits accruing therefrom under 35 U.S.C. §119, the content of which in its entirety is herein incorporated by reference.

BACKGROUND

1. Field

The present disclosure relates to an oxynitride phosphor, methods of preparing the oxynitride phosphor, and white light emitting devices including the oxynitride phosphor, and more particularly, to an oxynitride phosphor having excellent color rendering properties and color reproduction properties.

2. Description of the Related Art

An optical illumination system may include a fluorescent lamp or an incandescent lamp. Fluorescent lamps, however, cause environmental problems due to mercury (Hg) included therein. Also, such optical illumination systems have very short lifetimes and low efficiency and thus are unsuitable for energy saving applications. Therefore, much research is being performed to develop a white light emitting device having high efficiency.

Improved white light emitting devices may produce white light using the three following methods. Red, green, and blue phosphors may be excited using an ultra violet ("UV") light emitting diode ("LED") light source to produce white light, red and green phosphors may be excited using a blue LED light source to produce white light, or a yellow phosphor may be excited using a blue LED light source to produce white light.

However, a method of producing white light by exciting a single white phosphor using a UV LED light source has not yet been developed. In this method, color rendering properties may be improved by avoiding a situation wherein light with a wavelength around 480 nanometers (nm) is not provided, compared to a general method in which a blue LED and a yellow phosphor or a blue LED and a green phosphor are used. In addition, undesirable reabsorption, which may occur when using two or three phosphors, may be avoided. Even if the single white phosphor is used together with another phosphor, excellent color rendering properties may be obtained by virtue of a large half width value, compared to an embodiment wherein a white phosphor is not used.

Nitride phosphor preparation methods known hitherto require process conditions of high temperature and high nitrogen gas pressure (more than 0.1 megapascals, MPa). Thus, a special apparatus designed to withstand high temperature and high pressure is desirable. Moreover, unstable materials are used as starting materials, and thus, the stringency of conditions recommended to handle the starting materials increases.

SUMMARY

Provided is an oxynitride phosphor having a large half width value.

Provided are methods of preparing the oxynitride phosphor and white light emitting devices including the oxynitride phosphor.

Additional aspects will be set forth in part in the description which follows and, in part, will be apparent from the description.

According to an aspect, disclosed is an oxynitride phosphor including: a compound represented by Formula 1:

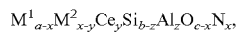   Formula 1 wherein $M^1$ is at least one element selected from the group consisting of calcium (Ca), strontium (Sr), barium (Ba), magnesium (Mg), zinc (Zn), and europium (Eu), $M^2$ is at least one element selected from the group consisting of scandium (Sc), yttrium (Y), lutetium (Lu), lanthanum (La), praseodymium (Pr), samarium (Sm), gadolinium (Gd), terbium (Tb), ytterbium (Yb), and dysprosium (Dy), a is about 1.7 to about 2.3, b is about 0.7 to about 1.3, c is about 3.5 to about 4.5, x is greater than 0 and less than about 2, y is equal to or greater than 0 and less than about 0.5, and z is equal to or greater than 0 and less than about 0.5.

$M^1$ may be a mixture of Sr and Eu.

The compound of Formula 1 may be $La_{x-y}Sr_{2-x}Ce_ySiO_{4-x}N_x$, wherein x is greater than 0 and less than about 2, and y is greater than 0 and less than about 0.5.

The compound represented by Formula 1 may be $La_{x-y}Ce_ySr_{2-x-w}Eu_wSiO_{4-x}N_x$, wherein x is greater than 0 and less than about 2, y is greater than 0 and less than about 0.5, and w is greater than 0 and less than about 0.5.

According to another aspect, a white light emitting device includes a light emitting diode ("LED"); and the oxynitride phosphor.

According to another aspect, a method of preparing an oxynitride phosphor includes mixing an $M^1$ precursor compound, an $M^2$ precursor compound, a silicon (Si) precursor compound, and a cerium (Ce) precursor compound to form a mixture; sintering the mixture; and pulverizing the sintered mixture to form the oxynitride phosphor.

In the mixing of the precursor compounds, an aluminum (Al) precursor compound may be added and the precursor compounds mixed.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
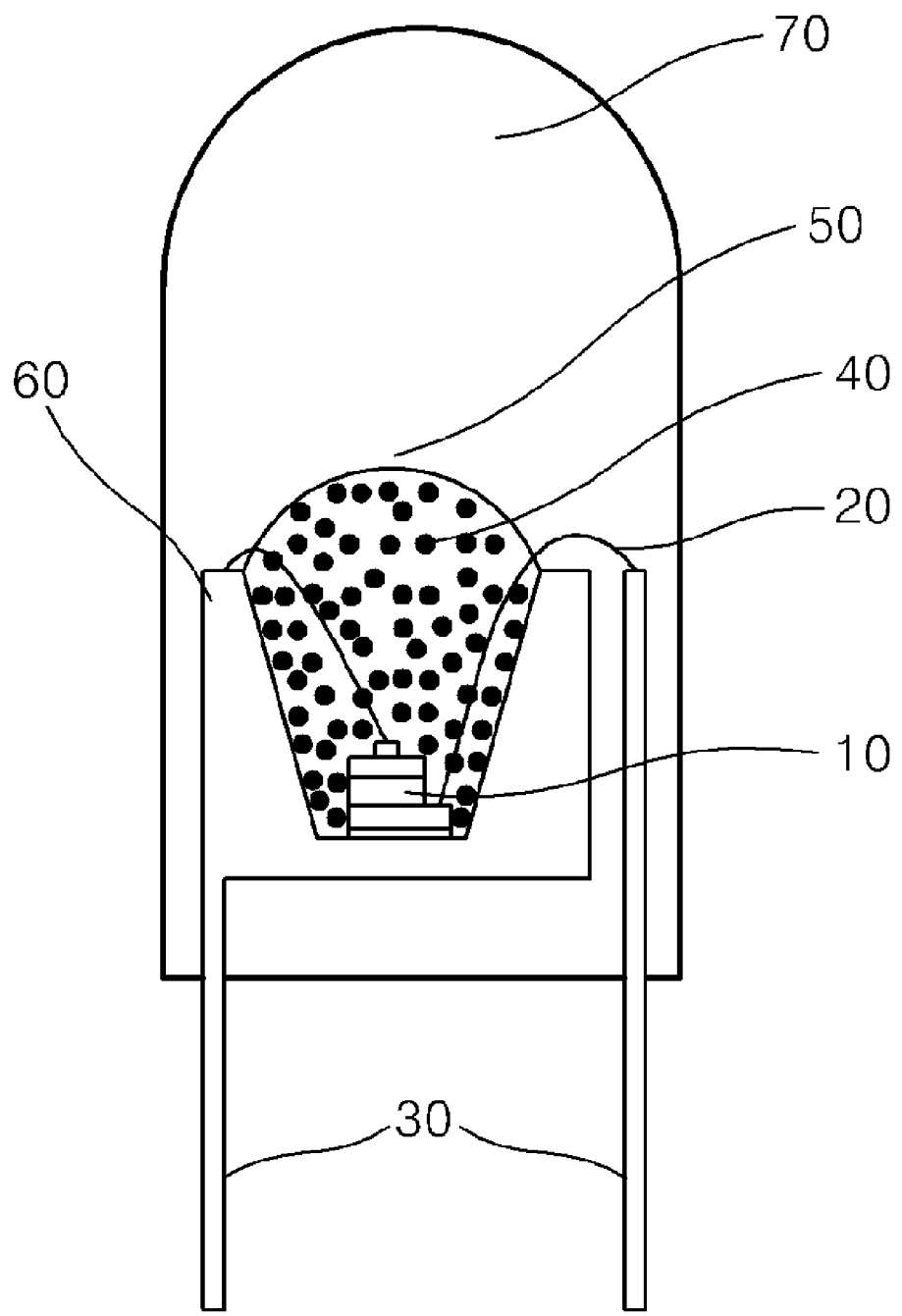
FIG. 1 is a schematic diagram illustrating an exemplary embodiment of a white light emitting device.

Reference will now be made in detail to embodiments, examples of which are illustrated in the accompanying drawings, wherein like reference numerals refer to the like elements throughout. In this regard, the embodiments may have different forms and should not be construed as being limited to the descriptions set forth herein. Accordingly, the embodiments are merely described below, by referring to the figures, to explain aspects of the present description.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer, or section from another element, component, region, layer or section. Thus, a first element, component, region, layer, or section discussed below could be termed a second element, component, region, layer, or section without departing from the teachings of the present invention.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, an oxynitride phosphor, a method of preparing the oxynitride phosphor and a white light emitting device including the oxynitride phosphor will be further disclosed with regard to exemplary embodiments.

According to an embodiment, an oxynitride phosphor comprises a compound represented by Formula 1:

$$M^1_{a-x}M^2_{x-y}Ce_ySi_{b-z}Al_zO_{c-x}N_x,$$ Formula 1 wherein $M^1$ is at least one metal selected from the group consisting of calcium (Ca), strontium (Sr), barium (Ba), magnesium (Mg), zinc (Zn), and europium (Eu), $M^2$ is at least one metal selected from the group consisting of scandium (Sc), yttrium (Y), lutetium (Lu), lanthanum (La), praseodymium (Pr), samarium (Sm), gadolinium (Gd), terbium (Tb), ytterbium (Yb), and dysprosium (Dy), and a is about 1.7 to about 2.3, b is about 0.7 to about 1.3, c is about 3.5 to about 4.5, x is greater than 0 and less than about 2, y is greater than 0 and less than about 0.5, and z is equal to or greater than 0 and less than about 0.5.

Because a general phosphor receives light from a light emitting diode ("LED") and emits a single light beam having a half width value of equal to or less than about 90 nanometers (nm), specifically about 10 nm to about 90 nm, more specifically about 20 nm to about 80 nm, a mixture of phosphors which emits different colors may be used in a light emitting device in order to obtain white light. When the mixture of phosphors is used, reabsorption may occur. Specifically, a phosphor emitting long-wavelength light may absorb light from a phosphor emitting short-wavelength light, and thus, overall efficiency of white light emission may be reduced.

With regard to an oxynitride phosphor according to an embodiment, because bivalent and trivalent cations, and $O^{2-}$ and $N^{3-}$ anions coexist in the oxynitride phosphor, the sizes of sites doped with light emitting ions may vary. Thus, light beams having various wavelengths may be emitted, and the emitted light beams may have a broadband emission wavelength range. For example, the oxynitride phosphor may have a half width value of equal to or greater than about 150 nm, specifically equal to or greater than about 200 nm, more specifically equal to or greater than about 250 nm, and may emit light in a wavelength region of about 400 to about 800 nm, specifically about 450 to about 680 nm, more specifically about 480 to about 630 nm. In addition, a high light-emitting intensity may be exhibited around a green wavelength region having a wavelength of about 520 nm and around a red wavelength region having a wavelength of about 620 nm.

An oxynitride phosphor according to an embodiment may produce white light having excellent color rendering properties by combination with an ultra violet ("UV") LED or a blue LED without mixing with another phosphor, specifically using only a single phosphor. Generally, white light may be produced by using a blue LED and a yellow emitting phosphor (e.g., yttrium aluminum garnet, "YAG"). The yellow emitting phosphor, such as YAG, has a low light-emitting intensity at a red wavelength region, and thus the color rendering properties may deteriorate. The oxynitride phosphor has a high light-emitting intensity at green-wavelength and red-wavelength regions, thus can provide white light having excellent color rendering properties.

In addition, the oxynitride phosphor has excellent excitation properties in a UV wavelength region, and absorbs a relatively small amount of blue-wavelength and green-wavelength light beams, thereby reducing loss in luminous efficiency of the oxynitride phosphor due to reabsorption. Therefore, because the oxynitride phosphor has a low absorption of visible light, if the oxynitride phosphor is mixed with another phosphor, reabsorption of light from a red or blue phosphor may not occur, thereby substantially preventing or effectively eliminating loss in luminous efficiency of the oxynitride phosphor due to reabsorption.

Therefore, the white light emitting device may be used as a special illumination device in a medical application, a food exhibition, or a museum, as a general illumination device, or as a backlight unit of a miniaturized display device such as a mobile device or a notebook computer. In addition, the white light emitting device may be used as a light source in a vehicle head lamp or in a communication device.

The compound represented by Formula 1 may be $La_{x-y}Sr_{2-x}Ce_ySiO_{4-x}N_x$, wherein x is greater than 0 and less than about 2 and y is greater than 0 and less than about 0.5. Alternatively, the compound represented by Formula 1 may be $La_{x-y}Ce_ySr_{2-x-w}Eu_wSiO_{4-x}N_x$, wherein x is greater than 0 and less than 2, y is greater than 0 and less than about 0.5, and w is greater than 0 and less than 0.5.

The compound represented by Formula 1 may be, for example, $LaSrSiO_3N:0.02Ce^{3+}$, $LaSrSiO_3N:0.05Ce^{3+}$, $La_{0.4}Sr_{1.6}SiO_{3.6}N_{0.4}:0.02Ce^{3+}$, $LaSrSiO_3N:0.02Ce^{3+}$, $0.02Eu^{2+}$, or $LaSrSiO_3N:0.02Ce^{3+},0.01Eu^{2+}$, or a combination comprising at least one of the foregoing.

A white light emitting device according to an embodiment includes an LED; and the oxynitride phosphor represented by Formula 1. The white light emitting device may have a color rendering index of equal to or greater than about 80, specifically equal to or greater than about 90.

The LED of the white emitting device may be a UV-LED or a blue LED, or a combination thereof. An excitation light source of the UV-LED may be ultra-violet electromagnetic radiation or near-ultraviolet radiation. In the white light-emitting device, an excitation light source of the UV-LED may have a wavelength of about 390 to about 420 nm, specifically about 395 to about 415 nm, more specifically about 390 to about 410 nm. An excitation light source of the blue LED may have a wavelength of about 420 to about 480 nm, specifically about 425 to about 475 nm, more specifically about 430 to about 470 nm.

The white light emitting device may further include at least one selected from the group consisting of a blue phosphor, a green phosphor, and a red phosphor. For example, white light emitting device may further include both of the blue and green phosphors.

The blue phosphor may be at least one selected from the group consisting of $(Sr,Ba,Ca)_5(PO_4)_3Cl:Eu^{2+}$; $BaMg_2Al_{16}O_{27}:Eu^{2+}$; $Sr_4Al_{14}O_{25}:Eu^{2+}$; $BaAl_8O_{13}:Eu^{2+}$; $(Sr,Mg,Ca,Ba)_5(PO_4)_3Cl:Eu^{2+}$; $BaMgAl_{10}O_{17}:Eu^{2+}$; and $Sr_2Si_3O_8 2SrCl_2:Eu^{2+}$.

The green phosphor may include at least one selected from the group consisting of $(Ba,Sr,Ca)_2SiO_4:Eu^{2+}$; $Ba_2MgSi_2O_7:Eu^{2+}$; $Ba_2ZnSi_2O_7:Eu^{2+}$; $BaAl_2O_4:Eu^{2+}$; $SrAl_2O_4:Eu^{2+}$; $BaMgAl_{10}O_{17}:Eu^{2+}$, $Mn^{2+}$; and $BaMg_2Al_{16}O_{27}:Eu^{2+},Mn^{2+}$.

The red phosphor may be at least one selected from the group consisting of $(Sr,Ca)S:Eu^{2+}$; $(Sr,Ca)AlSiN_3:Eu^{2+}$; $Sr_2Si_5N_8:Eu^{2+}$; $(Sr,Ba,Ca)_2P_2O_7:Eu^{2+},Mn^{2+}$; $(Ba,Mg)SiO_4:Eu^{2+},Mn^{2+}$; $(Ba,Ca)Ga_2O_7:Eu^{2+},Mn^{2+}$; $Ba_2MgSi_2O_7:Eu^{2+},Mn^{2+}$; and $3.5MgO.0.5MgF_2.GeO_4:Mn^{4+}$.

A peak wavelength of the blue phosphor is about 440 to about 460 nm, specifically about 445 to about 455 nm, more specifically about 450 nm.

A peak wavelength of the green phosphor may be about 510 to about 560 nm, specifically about 515 to about 555 nm, more specifically about 520 to about 550 nm.

A peak wavelength of the red phosphor may be about 600 to about 670 nm, specifically 610 to about 660 nm, more specifically about 620 to about 650 nm.

FIG. 1 is a schematic view of an exemplary embodiment of a white light emitting device. The white light emitting device of FIG. 1 is a polymer lens type, surface-mounted white light emitting device. An epoxy lens is an example of the polymer lens.

Referring to FIG. 1, a UV LED chip 10 may be die-bonded to an electric lead line 30 via a gold wire 20, and an epoxy mold layer 50 may be formed on the UV LED chip 10 using a phosphor composition 40 including the oxynitride phosphor represented by Formula 1. A reflective film coated with aluminum or silver may be formed on an inner surface of a mold 60 to reflect light upward from the UV LED chips 10 and to limit the epoxy of the epoxy mold layer 50 to an appropriate amount.

An epoxy dome lens 70 may be formed above the epoxy mold layer 50. The shape of the epoxy dome lens 70 may vary according to a desired orientation angle.

The LED used in the white light-emitting device is not limited to the structure illustrated in FIG. 1. Other structures, e.g., a phosphor-mounted LED, a lamp-type LED, and a PCB-type surface-mounted LED may also be used.

A method of preparing the oxynitride phosphor, according to another embodiment, may include mixing an $M^1$ precursor compound, an $M^2$ precursor compound, a silicon (Si) precursor compound, and a cerium (Ce) precursor compound to form a mixture; sintering the mixture; and pulverizing the sintered mixture. The mixture is sintered in the presence of a nitrogen source and an oxygen source. The nitrogen source and the oxygen source may be the same or different, and may be, for example, one or more of the precursor compounds, nitrogen gas, oxygen gas, or a combination of the foregoing sources.

The $M^1$ precursor compound may include at least one metal selected from the group consisting of calcium (Ca), strontium (Sr), barium (Ba), magnesium (Mg), zinc (Zn), and europium (Eu), and the $M^2$ precursor compound may include at least one metal selected from the group consisting of scandium (Sc), yttrium (Y), lutetium (Lu), lanthanum (La), praseodymium (Pr), samarium (Sm), gadolinium (Gd), terbium (Tb), ytterbium (Yb), and dysprosium (Dy). For example, the La precursor compound may include at least one selected from the group consisting of $La_2O_3$, $LaN$, $La_2(CO_3)_3$, $La(NO_3)_3$, $La(OH)_3$, and $LaCl_3$. The Sr precursor compound may include at least one selected from the group consisting of $SrCO_3$, $Sr(NO_3)_2$, $SrCl_2$, and $SrO$. The Si precursor compound may include at least one selected from the group consisting of $SiO_2$, $Si_3N_4$, and $Si(NH)_2$. The Ce precursor compound may be at least one selected from the group consisting of $CeO_2$, $Ce_2(CO_3)_3$, $(NH_4)_{2-x}Ce(NO_3)_6$, and $CeCl_4$. The Eu precursor compound may include at least one selected from the group consisting of $Eu_2O_3$, $Eu(NO_3)_3$, and $EuCl_3$.

In the mixing of the precursor compounds, an aluminum (Al) precursor compound may be added and mixed. The Al precursor compound may be at least one selected from the group consisting of AlN, $Al_2O_3$, and $Al(OH)_3$.

When $Si_3N_4$ and AlN are used as the Si precursor compound and the Al precursor compound, respectively, $Si_3N_4$ and AlN may be stable in the atmosphere, and may be sintered in a general furnace (e.g., tube furnace) at a temperature of about 1400 to about 1700° C., specifically 1500 to about 1600° C., more specifically 1550° C.

The method according an embodiment will now be disclosed in further detail.

The $M^1$ precursor compound, the $M^2$ precursor compound, the Si precursor compound, the Al precursor compound, and the Ce precursor compound are mixed. The mixture is sintered under a nitrogen/hydrogen reducing atmosphere for about 1 to about 20 hours, specifically about 2 to about 19 hours, more specifically about 3 to about 18 hours, at a temperature of about 1100 to about 1900° C., specifically about 1200 to about 1800° C., more specifically about 1300 to about 1700° C. Then, the sintered mixture is pulverized to obtain an oxynitride phosphor.

The $M^1$ precursor compound, the $M^2$ precursor compound, the Si precursor compound, the Al precursor compound and the Ce precursor compound may be used in amounts that correspond to the composition of Formula 1. In addition, with respect to a molar ratio of metal ions of in mixture of precursors, a molar ratio of the sum of the moles of the $M^1$, $M^2$, and Ce precursor compounds to the sum of the moles of the Si and Al precursor compounds may be about 2:1. In an embodiment, effective efficiencies may be obtained even if an error of about 10% in the molar ratio occurs.

Hereinafter, one or more embodiments will be disclosed in further detail with reference to the following examples. However, these examples are not intended to limit the purpose and scope of the disclosed embodiments.

Example 1

Preparation of $LaSrSiO_3N:0.02Ce^{3+}$ Phosphor

An oxynitride phosphor was prepared using a solid phase reaction method. Powders of the precursors in the amounts (in grams) indicated for Example 1 in Table 1 below were mixed using a mortar for 10 minutes. The mixed powders were placed in an alumina reaction vessel and sintered under a reducing atmosphere of $N_2/H_2=95/5$ (by volume) at 1500° C. for 6 hours. The resulting material was pulverized using a mortar for 10 minutes.

Example 2

Preparation of $LaSrSiO_3N:0.05Ce^{3+}$ Phosphor

A phosphor was prepared in the same manner as in Example 1 except that the powders of the precursors in the amounts indicated for Example 2 in Table 1 below were used.

Example 3

Preparation of $La_{0.4}Sr_{1.6}SiO_{3.6}N_{0.4}:0.02Ce^{3+}$ Phosphor

A phosphor was prepared in the same manner as in Example 1 except that powders of the precursors in the amounts indicated for Example 3 in Table 1 below were used.

Example 4

Preparation of $LaSrSiO_3N:0.02Ce^{3+}$, 0.02 $Eu^{2+}$ Phosphor

A phosphor was prepared in the same manner as in Example 1 except that powders of the precursors in the amounts indicated for Example 4 in Table 1 below were used.

Example 5

Preparation of $LaSrSiO_3N:0.02Ce^{3+}$, $0.01Eu^{2+}$ Phosphor

A phosphor was prepared in the same manner as in Example 1 except that powders of the precursors in the amounts indicated for Example 5 in Table 1 below were used.

Comparative Example 1

Preparation of $LaSrSiO_3N:0.02Eu^{2+}$ Phosphor

A phosphor was prepared in the same manner as in Example 1 except that powders of the precursors in the amounts indicated for Comparative Example 1 in Table 1 below were used.

Comparative Example 2

Preparation of $Sr_2SiO_4:0.02Ce^{3+}$

A phosphor was prepared in the same manner as in Example 1 except that powders of the precursors in the amounts indicated for Comparative Example 2 in Table 1 below were used and the mixed powders were sintered at 1400° C.

TABLE 1

| | $La_2O_3$ (g) | $SrCO_3$ (g) | $Si_3N_4$ (g) | $SiO_2$ (g) | $CeO_2$ (g) | $Eu_2O_3$ (g) |
|---|---|---|---|---|---|---|
| Example 1 | 5.52 | 5.00 | 1.58 | 0 | 0.12 | 0 |
| Example 2 | 5.52 | 5.00 | 1.58 | 0 | 0.29 | 0 |
| Example 3 | 2.21 | 8 | 0.95 | 0.81 | 0.12 | 0 |
| Example 4 | 5.52 | 5.00 | 1.58 | 0 | 0.12 | 0.12 |
| Example 5 | 5.52 | 5.00 | 1.58 | 0 | 0.12 | 0.06 |
| Comparative Example 1 | 5.52 | 5.00 | 1.58 | 0 | 0 | 0.12 |
| Comparative Example 2 | 0 | 4.92 | 0 | 1.00 | 0.12 | 0 |

Figure 2:
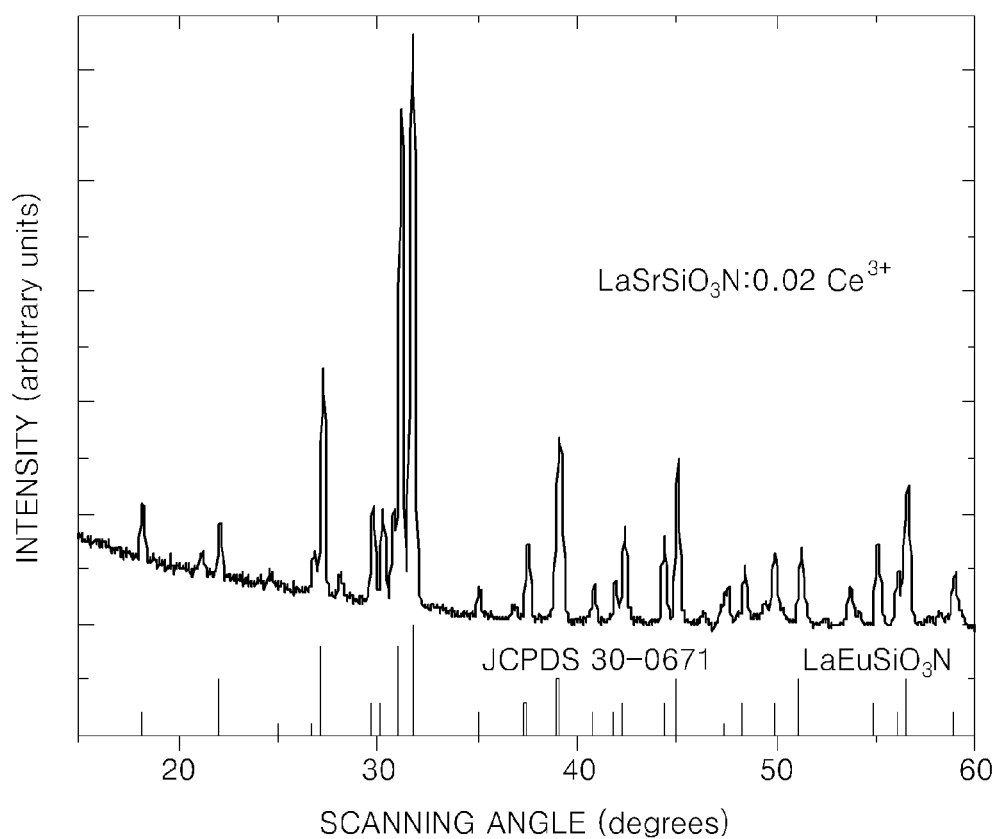
FIG. 2 is a graph of X-ray diffraction intensity (arbitrary units) versus scattering angle (degrees) illustrating an X-ray diffraction ("XRD") spectrum of a phosphor prepared in Example 1, and Joint Committee on Powder Diffraction Standards ("JCPDS") card 30-0671, which is an idealized calculated pattern for $LaEuSiO_3N$.

FIG. 2 is a graphical view of an X-ray diffraction ("XRD") spectrum of the phosphor prepared in Example 1, and Joint Committee on Powder Diffraction Standards ("JCPDS") card 30-0671, which is an idealized calculated pattern for $LaEuSiO_3N$. In FIG. 2, the XRD peaks of $LaEuSiO_3N$ are included as a reference.

As shown in the XRD spectrum of FIG. 2, the $LaSrSiO_3N$: $0.02Ce^{3+}$ phosphor prepared in Example 1 has a Pnma orthorhombic structure that is similar to that of LaEuSiO₃N, and has the same crystal structure as that of Sr₂SiO₄. By virtue of having the same crystal structure, even if La—N moieties are substituted for some of the Sr—O in Sr₂SiO₄, it may be assumed that the crystal structure (e.g. the phosphor) is stable.

Figure 3:
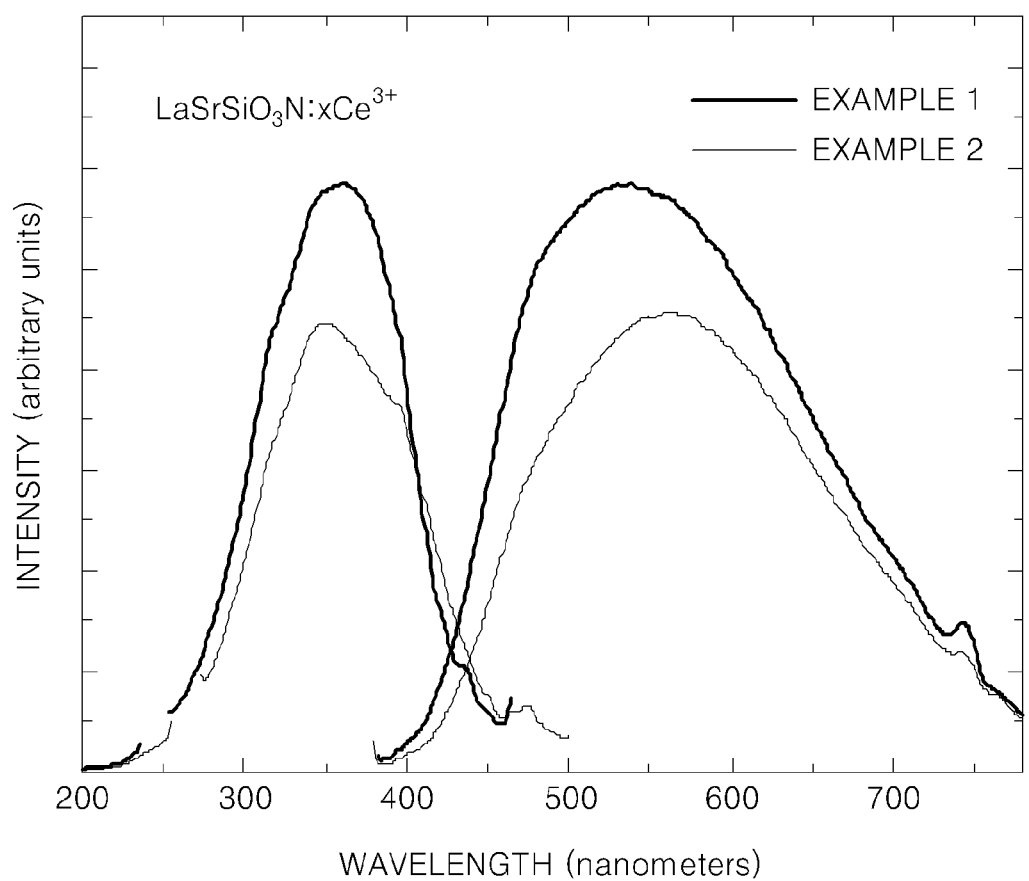
FIG. 3 is a graph of intensity (arbitrary units) versus wavelength (nanometers) illustrating excitation and emission spectra of phosphors prepared in Examples 1 and 2.

FIG. 3 is a graph of excitation and emission spectra of the phosphors prepared in Examples 1 and 2. The phosphors are prepared by doping LaSrSiO₃N with Ce having molar ratios of 0.02 and 0.05 with respect to La. In addition, the excitation and emission spectra of the phosphors are shown. The LaSrSiO₃N:0.02Ce³⁺ phosphor may have an excellent absorption rate at an emission wavelength of a UV LED of 400 nm, and may have an emission peak of 535 nm. However, the LaSrSiO₃N:0.02Ce³⁺ phosphor has a large half width value of about 200 nm, thereby emitting white light overall. Although two kinds of doping sites exist in the crystal structure of LaSrSiO₃N, various doping sites are formed according to the distribution of La and Sr, and O and N around the two kinds of doping sites. Thus, the LaSrSiO₃N:0.02Ce³⁺ phosphor has a large half width value. In FIG. 3, it may be seen that a red shift towards about 560 nm occurs on an emission peak of the LaSrSiO₃N:0.05Ce³⁺ phosphor, as compared to an emission peak of the LaSrSiO₃N:0.02Ce³⁺ phosphor. While not wanting to be bound by theory, it is believed that this is because as the concentration of Ce increases, the amount of Ce doped in a site where a length of Ce—N is short is increased, and energy is easily transferred towards Ce ions having low energy among the doped Ce.

Figure 4:
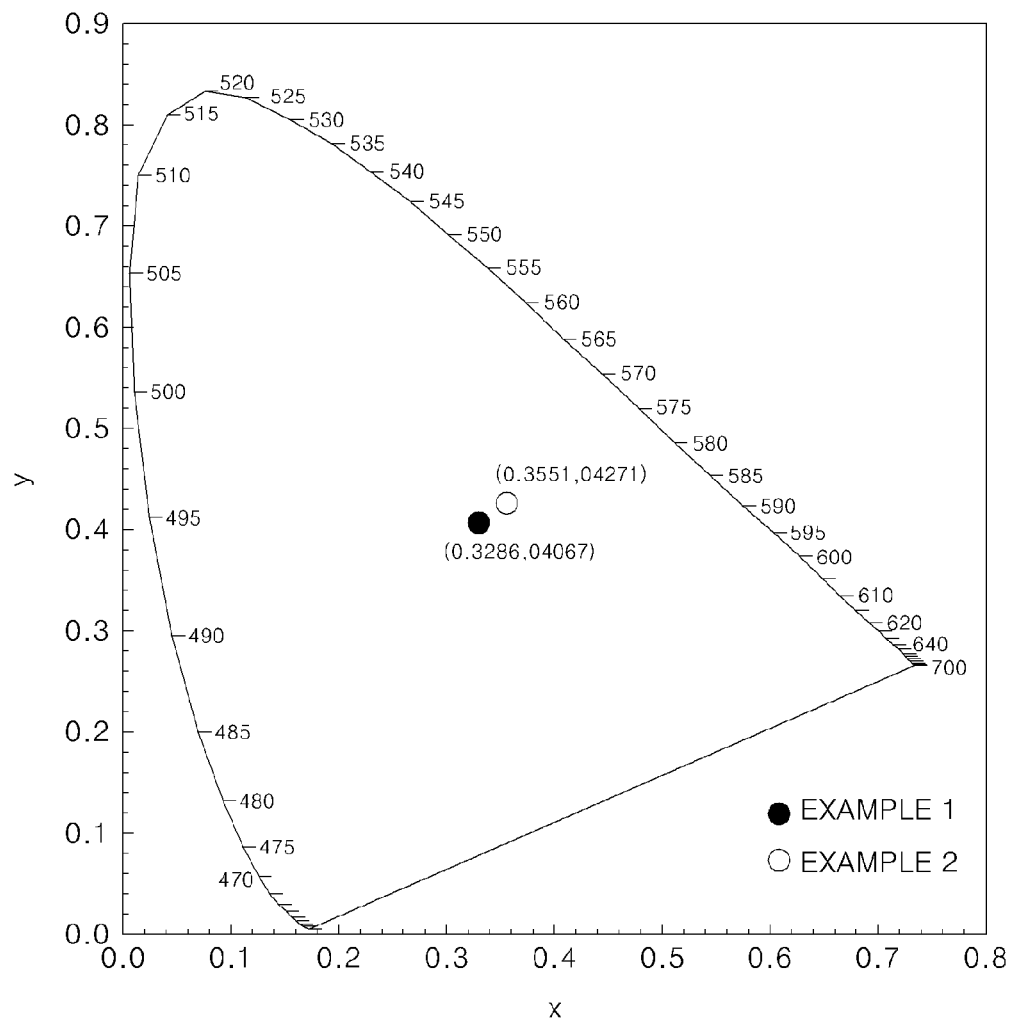
FIG. 4 is a graphical view illustrating locations of emission spectra of phosphors prepared in Examples 1 and 2 on a color coordinate system.

FIG. 4 is a color coordinate system illustrating locations of the phosphors prepared in Examples 1 and 2. FIG. 4 shows that the phosphors exhibit almost white light. A color rendering index ("CRI") of the phosphors is about 82, which is higher than that of an embodiment wherein a blue LED and a yellow phosphor are used, which is, about 70.

Figure 5:
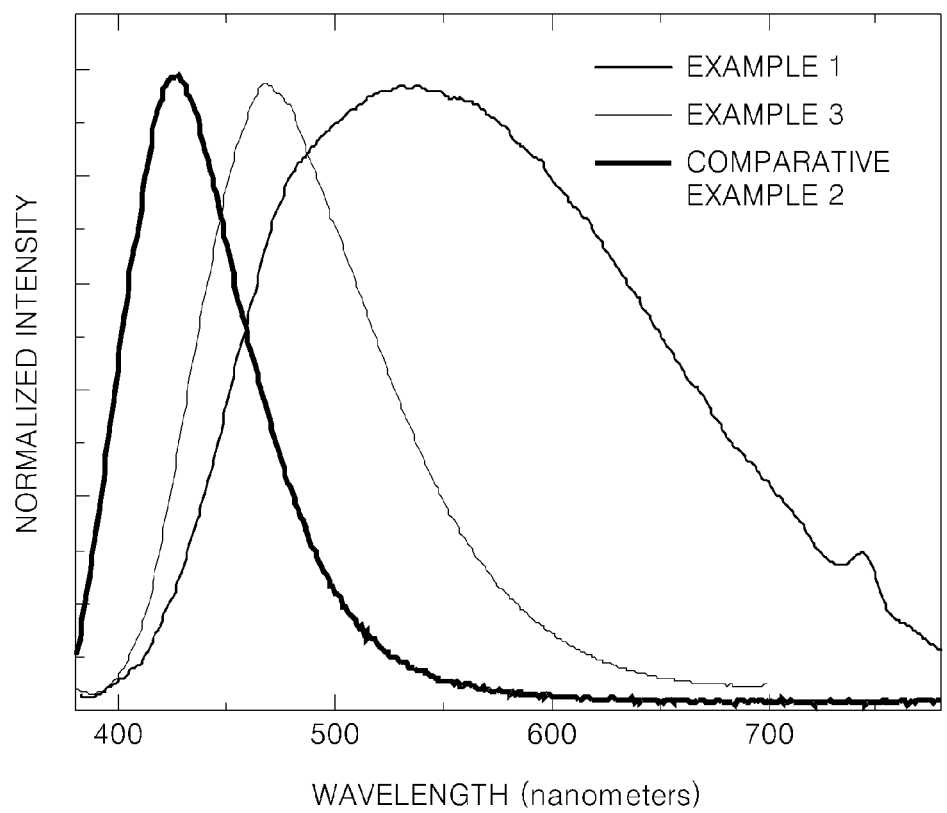
FIG. 5 is a graph of normalized intensity versus wavelength (nanometers) illustrating emission spectra of phosphors prepared in Examples 1 and 3, and Comparative Examples 2.

FIG. 5 is a graph of emission spectra of the phosphors prepared in Examples 1 and 3, and Comparative Example 2. From the emission spectra of the phosphors a ratio of La/Sr is changed and simultaneously a ratio of N/O is changed for charge balance, it may be seen that as the ratio of La/Sr increases, an emission peak wavelength is lengthened, and a half width value is increased.

A half width value is increased when various sites at which an activator is to be doped exist due to coexistence of ions. In addition, an emission peak wavelength is lengthened when a covalent bond between an activator and an anion is strengthened because oxygen is substituted for nitrogen. Due to the crystal structure of the oxynitride phosphor having a high degree of freedom of ions included in the oxynitride phosphor, the oxynitride phosphor may easily emit light having various peak wavelengths.

Figure 6:
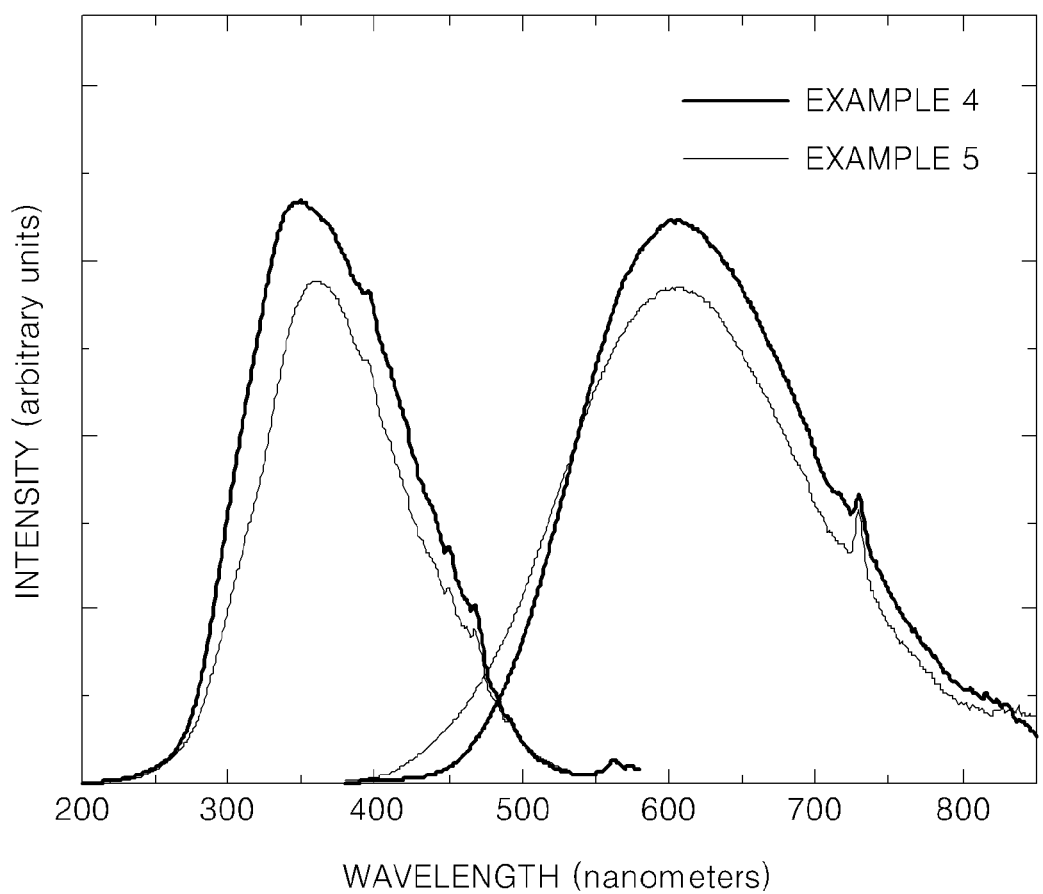
FIG. 6 is a graph of intensity (arbitrary units) versus wavelength (nanometers) illustrating excitation and emission spectra of phosphors prepared in Examples 4 and 5.

FIG. 6 is a graph of excitation and emission spectra of the phosphors prepared in Examples 4 and 5. In an embodiment wherein Eu²⁺ is doubly doped in a phosphor doped with Ce³⁺, an emission spectrum of Ce³⁺ overlaps an absorption spectrum of Eu²⁺, and a significant amount of energy from Ce³⁺ is transferred to of Eu²⁺. Thus, the emission properties of Eu²⁺ are more prominent than those of Ce³⁺. As the concentration of Eu²⁺ increases, this phenomenon is stronger.

As described above, according to the one or more of the above embodiments, an oxynitride phosphor exhibits excellent color rendering properties and color reproduction properties when the oxynitride phosphor is used in a white light emitting device.

It is understood that the exemplary embodiments disclosed herein are to be considered in a descriptive sense only and not for purposes of limitation. Descriptions of features or aspects within each embodiment should be considered as available for other similar features or aspects in other embodiments.

What is claimed is:

1. An oxynitride phosphor comprising:
a compound represented by Formula 1:

$$M^1_{a-x}M^2_{x-y}Ce_ySi_{b-z}Al_zO_{c-x}N_x,$$ Formula 1 wherein $M^1$ is at least one element selected from the group consisting of calcium, strontium, barium, magnesium, zinc, and europium, $M^2$ is at least one element selected from the group consisting of scandium, yttrium, lutetium, lanthanum, praseodymium, samarium, gadolinium, terbium, ytterbium, and dysprosium, a is about 1.7 to about 2.3, b is about 0.7 to about 1.3, c is about 3.5 to about 4.5, x is greater than 0 and less than about 2, y is greater than 0 and less than about 0.5, and z is equal to or greater than 0 and less than about 0.5.

2. The oxynitride phosphor of claim 1, wherein $M^1$ is a mixture of Sr and Eu.

3. The oxynitride phosphor of claim 1, wherein the compound of Formula 1 is $La_{x-y}Sr_{2-x}Ce_ySiO_{4-x}N_x$, wherein x is greater than 0 and less than about 2, and y is greater than 0 and less than about 0.5.

4. The oxynitride phosphor of claim 1, wherein the compound represented by Formula 1 is $La_{x-y}Ce_ySr_{2-x-w}Eu_wSiO_{4-x}N_x$, wherein x is greater than 0 and less than about 2, y is greater than 0 and less than about 0.5, and w is greater than 0 and less than about 0.5.

5. The oxynitride phosphor of claim 1, wherein a half width value of an emission spectrum of the oxynitride phosphor is equal to or greater than about 150 nanometers.

6. The oxynitride phosphor of claim 1, wherein an emission wavelength of the oxynitride phosphor is about 450 to about 680 nanometers.

7. A white light emitting device comprising:
a light emitting diode; and
the oxynitride phosphor of claim 1.

8. The white light emitting device of claim 7, wherein a color rendering index is equal to or greater than about 80.

9. The white light emitting device of claim 7, wherein the light emitting diode is an ultraviolet light emitting diode.

10. The white light emitting device of claim 9, wherein an excitation light source of the light emitting diode has a wavelength band of about 390 to about 460 nanometers.

11. The white light emitting device of claim 9, further comprising at least one selected from a group consisting of a blue phosphor, a green phosphor, and a red phosphor.

12. The white light emitting device of claim 11, wherein the blue phosphor is at least one selected from the group consisting of $(Sr,Ba,Ca)_5(PO_4)_3Cl:Eu^{2+}$; $BaMg_2Al_{16}O_{27}:Eu^{2+}$; $Sr_4Al_{14}O_{25}:Eu^{2+}$; $BaAl_8O_{13}:Eu^{2+}$; $(Sr,Mg,Ca,Ba)_5(PO_4)_3Cl:Eu^{2+}$; $BaMgAl_{10}O_{17}:Eu^{2+}$; and $Sr_2Si_3O_8 2SrCl_2:Eu^{2+}$.

13. The white light emitting device of claim 11, wherein the green phosphor comprises at least one selected from a group consisting of $(Ba,Sr,Ca)_2SiO_4:Eu^{2+}$; $Ba_2MgSi_2O_7:Eu^{2+}$; $Ba_2ZnSi_2O_7:Eu^{2+}$; $BaAl_2O_4:Eu^{2+}$; $SrAl_2O_4:Eu^{2+}$; $BaMgAl_{10}O_{17}:Eu^{2+}, Mn^{2+}$; and $BaMg_2Al_{16}O_{27}:Eu^{2+},Mn^{2+}$.

14. The white light emitting device of claim 11, wherein the red phosphor is at least one selected from the group consisting of $(Sr,Ca)S:Eu^{2+}$; $(Sr,Ca)AlSiN_3:Eu^{2+}$; $Sr_2Si_5N_8:Eu^{2+}$; $(Sr,Ba,Ca)_2P_2O_7:Eu^{2+},Mn^{2+}$; $(Ba,Mg)SiO_4:Eu^{2+},Mn^{2+}$; $(Ba,Ca)Ga_2O_7:Eu^{2+},Mn^{2+}$; $Ba_2MgSi_2O_7:Eu^{2+},Mn^{2+}$; and $3.5MgO.0.5MgF_2.GeO_4:Mn^{4+}$.

15. The white light emitting device of claim 7, wherein a peak wavelength of an emission spectrum of the oxynitride phosphor is about 400 to about 800 nanometers.

16. The white light emitting device of claim 7, wherein a peak wavelength of an emission spectrum of the oxynitride phosphor is about 450 to about 680 nanometers.

17. The white light emitting device of claim 7, wherein the light emitting diode is a blue light emitting diode.

18. The white light emitting device of claim 7, wherein the white light emitting device is used in an application selected from the group consisting of a traffic light, a light source of a communication device, a backlight of a display device, and an illumination application.

19. A method of preparing an oxynitride phosphor comprising a compound represented by Formula 1:

$$M^1_{a-x}M^2_{x-y}Ce_ySi_{b-z}Al_zO_{c-x}N_x, \quad \text{Formula 1}$$

wherein

M$^1$ is at least one element selected from the group consisting of calcium, strontium, barium, magnesium, zinc, and europium, M$^2$ is at least one element selected from the group consisting of scandium, yttrium, lutetium, lanthanum, praseodymium, samarium, gadolinium, terbium, ytterbium, and dysprosium, a is about 1.7 to about 2.3, b is about 0.7 to about 1.3, c is about 3.5 to about 4.5, x is greater than 0 and less than about 2, y is greater than 0 and less than about 0.5, and z is equal to or greater than 0 and less than about 0.5, the method comprising:

mixing an M$^1$ precursor compound, an M$^2$ precursor compound, a silicon precursor compound, and a cerium (Ce) precursor compound to form a mixture;

sintering the mixture in the presence of an oxygen source and a nitrogen source; and pulverizing the sintered mixture to form the oxynitride phosphor.

* * * * *